United States Patent
Tanzawa et al.

(10) Patent No.: US 9,536,582 B2
(45) Date of Patent: *Jan. 3, 2017

(54) ENABLE/DISABLE OF MEMORY CHUNKS DURING MEMORY ACCESS

(71) Applicant: Micron Technology, Inc., Boise, ID (US)

(72) Inventors: Toru Tanzawa, Adachi (JP); Satoru Tamada, Kamakura (JP); Koichi Kawai, Yokohama (JP); Tetsuji Manabe, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/725,697

(22) Filed: May 29, 2015

(65) Prior Publication Data

US 2015/0262636 A1 Sep. 17, 2015

Related U.S. Application Data

(63) Continuation of application No. 13/718,801, filed on Dec. 18, 2012, now Pat. No. 9,064,578.

(51) Int. Cl.
| | |
|---|---|
| *G11C 8/12* | (2006.01) |
| *G11C 7/00* | (2006.01) |
| *G11C 16/06* | (2006.01) |
| *G11C 7/18* | (2006.01) |

(Continued)

(52) U.S. Cl.
CPC . *G11C 8/12* (2013.01); *G11C 7/00* (2013.01); *G11C 7/18* (2013.01); *G11C 16/06* (2013.01); *G11C 16/08* (2013.01); *G11C 16/0483* (2013.01); *G11C 2207/005* (2013.01); *G11C 2207/2245* (2013.01)

(58) Field of Classification Search
CPC . G11C 16/0483; G11C 16/3427; G11C 16/30; G11C 16/12
See application file for complete search history.

(56) References Cited

U.S. PATENT DOCUMENTS

| | | | |
|---|---|---|---|
| 5,828,621 | A | 10/1998 | Tanzawa et al. |
| 7,940,564 | B2 | 5/2011 | Park et al. |
| 8,004,885 | B2 | 8/2011 | Yun et al. |

(Continued)

OTHER PUBLICATIONS

Chen, Yi-Chou, et al., "An Access-Transistor-Free (0T/1R) Non-Volatile Resistance Random Access Memory (RRAM) Using a Novel Threshold Switching, Self-Rectifying Chalcogenide Device", Electron Devices Meeting, IEDM Technical Digest. IEEE International, (2003), 37.4.1-37.4.4.

(Continued)

*Primary Examiner* — Richard Elms
*Assistant Examiner* — Ajay Ojha
(74) *Attorney, Agent, or Firm* — Schwegman Lundberg & Woessner, P.A.

(57) ABSTRACT

Apparatuses and methods involving accessing memory cells are described. In one such method, chunks of memory cells in a memory array are enabled to be accessed and then one or more of the chunks are disabled from being accessed. In one such apparatus, an array includes chunks of memory cells and a chunk selector circuit coupled to each chunk to enable the memory cells in the respective chunk to be accessed. Additional embodiments are described.

20 Claims, 6 Drawing Sheets

(51) Int. Cl.
*G11C 16/08* (2006.01)
*G11C 16/04* (2006.01)

(56) References Cited

U.S. PATENT DOCUMENTS

| | | |
|---|---|---|
| 2004/0236896 A1 | 11/2004 | Kanapathippillai et al. |
| 2005/0230724 A1 | 10/2005 | Hsu |
| 2005/0232012 A1 | 10/2005 | Park |
| 2007/0252201 A1 | 11/2007 | Kito et al. |
| 2008/0106924 A1 | 5/2008 | Cho et al. |
| 2009/0157964 A1 | 6/2009 | Kasorla et al. |
| 2009/0161437 A1 | 6/2009 | Pyeon et al. |
| 2009/0196102 A1 | 8/2009 | Kim |
| 2009/0196103 A1* | 8/2009 | Kim .................. G11C 8/08 365/185.12 |
| 2011/0299314 A1 | 12/2011 | Samachisa et al. |
| 2014/0169098 A1 | 6/2014 | Tanzaw et al. |

OTHER PUBLICATIONS

Chiang, M H, et al., "Novel High-Density Low-Power Logic Circuit Techniques Using DG Devices", IEEE ED, 52(10), (2005), 2339-42.

Cho, Woo Yeong, et al., "A 0.18 μm 3.0 V 64 Mb non-volatile phase-transition random-access memory (PRAM)", IEEE Journal of Solid-State Circuits, vol. 40, No. 1, (Jan. 2005), 293-300.

Crowley, Matthew, et al., "512 Mb PROM with 8 layers of antifuse/diode cells", 2003 IEEE International Solid-State Circuits Conference, 2003. Digest of Technical Papers. ISSCC, (2003), 284-293.

Jang, J., et al., "Vertical cell array using TCAT(Terabit Cell Array Transistor) technology for ultra high density NAND flash memory", Symposium on VLSI Technology, (2009), 192-193.

Johnson, Mark, et al., "512-Mb PROM with a three-dimensional array of diode/antifuse memory cells", IEEE Journal of Solid-State Circuits, 38(11), (2003), 1920-1928.

Katsumata, R., et al., "Pipe-shaped BiCS flash memory with 16 stacked layers and multi-level-cell operation for ultra high density storage devices", Symposium on VLSI Technology, (Jun. 2009), 136-37.

Kim, J., et al., "Novel Vertical-Stacked Array-Transistor (VSAT) for ultra-high-density and cost-effective NAND Flash memory devices and SSD (Solid State Drive)", Symposium on VLSI Technology, (2009), 186-187.

Kim, W., et al., "Multi-layered Vertical Gate NAND Flash overcoming stacking limit for terabit density storage", Symposium on VLSI Technology, (2009), 188-89.

Sakui, K, et al., "Design Impacts on NAND Flash Memory Core Circuits with Vertical MOSFETs", IEEE International Memory Workshop (IMW), (May 2010), 1-4.

Tanaka, H., et al., "Bit Cost Scalable Technology with Punch and Plug Process for Ultra High Density Flash Memory", IEEE Symposium on VLSI Technology, (2007), 14-15.

Tanzawa, T., et al., "Circuit techniques for a 1.8-V-only NAND flash memory", IEEE Journal of Solid-State Circuits, 37(1), (Jan. 2002), 84-89.

* cited by examiner

ENABLE/DISABLE OF MEMORY CHUNKS DURING MEMORY ACCESS

PRIORITY APPLICATION

This application is a continuation of U.S. application Ser. No. 13/718,801, filed Dec. 18, 2012, which is incorporated herein by reference in its entirety.

BACKGROUND

Semiconductor memory devices formed in integrated circuits (ICs) are used in many electronic devices such as personal digital assistants (PDAs), laptop computers, mobile phones and digital cameras.

BRIEF DESCRIPTION OF THE DRAWINGS

Some embodiments are illustrated by way of example and not limitation in the figures of the accompanying drawings in which.

DETAILED DESCRIPTION

For the purposes of this document, a memory cell (cell) includes a phase change memory cell, a dynamic random access memory (DRAM) memory cell, or a charge storage memory cell, such as a transistor having a charge trap or a floating gate, for example, although embodiments are not specifically limited to just those cells. Each cell may comprise a multi-state device capable of storing one of multiple separate and distinct states, each state representing different data. An "apparatus" can refer to any of a number of structures, such as circuitry, a device or a system.

In this document, a charge storage device or a transistor is described as being switched "on" to assume an activated state when it is rendered conductive by a control gate voltage that is separated from its source voltage by at least its threshold voltage. The charge storage device or the transistor is described as being switched "off" to assume an inactive state when the difference between the control gate voltage and the source voltage is less than the threshold voltage, so that the charge storage device or the transistor is rendered non-conductive.

A programming operation can include multiple program pulses to program cells in a block of cells. All of the access lines to the block of cells can be biased during the entire programming operation even when some of the cells are programmed by one program pulse and more of the cells are programmed by two program pulses. The biased access lines can consume power unnecessarily during the programming operation when some of the access lines remain biased after their associated cells have been programmed. The access lines can also be biased during a read operation. The inventor has discovered that the challenges noted above, as well as others, can be addressed by enabling some chunks of cells and disabling other chunks of cells in a block of cells during a programming operation or a read operation.

Figure 1:
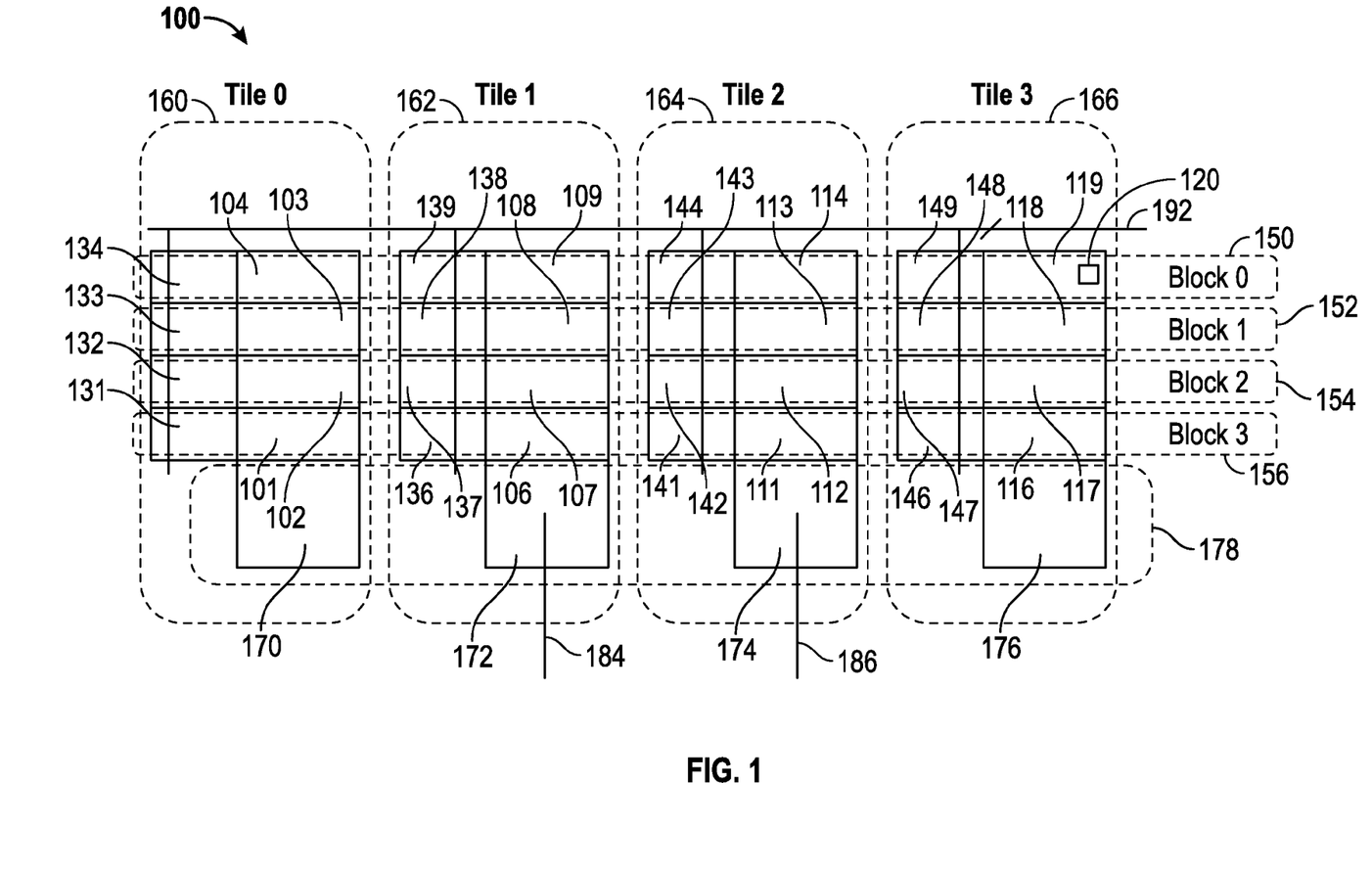
FIG. 1 is a block diagram of an apparatus in the form of a portion of an array of cells according to various embodiments of the invention.

FIG. 1 is a block diagram of an apparatus in the form of a portion of an array 100 of cells according to various embodiments of the invention. The array 100 can be formed on a semiconductor substrate (not shown). The cells in the array 100 are divided into chunks 101, 102, 103, 104, 106, 107, 108, 109, 111, 112, 113, 114, 116, 117, 118 and 119. Each of the chunks 101-119 includes two or more cells that can be accessed by one or more access lines (e.g., word lines, not shown) and provide data on one or more data lines (e.g., bit lines, not shown). For example, the chunk 119 includes a cell 120. Each of the chunks 101-119 may contain thousands of cells.

Each of the chunks 101, 102, 103 and 104 is connected to a respective chunk selector circuit 131, 132, 133 and 134 in the array 100. Each of the chunks 106, 107, 108 and 109 is connected to a respective chunk selector circuit 136, 137, 138 and 139 in the array 100. Each of the chunks 111, 112, 113 and 114 is connected to a respective chunk selector circuit 141, 142, 143 and 144 in the array 100. Each of the chunks 116, 117, 118 and 119 is connected to a respective chunk selector circuit 146, 147, 148 and 149 in the array 100. The chunk selector circuits 131-149 are located next to the respective chunks 101-119 and enable or disable local access lines (not shown) in the respective chunks 101-119 as will be described hereinbelow.

The chunks 101-119 (and the respective chunk selector circuits 131-149) are arranged in blocks. The chunks 104, 109, 114 and 119 are in a first block 150 labeled Block 0. The chunks 103, 108, 113 and 118 are in a second block 152 labeled Block 1. The chunks 102, 107, 112 and 117 are in a third block 154 labeled Block 2. The chunks 101, 106, 111 and 116 are in a fourth block 156 labeled Block 3. Each block is comprised of four of the chunks 101-119. Each block comprises at least two chunks of cells and may contain three, four or more than four chunks of cells. All of the chunks in a selected block can be enabled to be accessed simultaneously. For example, all of the chunks in a selected block can be enabled to be programmed or read by the respective chunk selector circuits at the beginning of a programming operation or a read operation, respectively. The chunks in the selected block can be disabled from being accessed individually or in groups.

The chunks 101-119 (and the respective chunk selector circuits 131-149) are also arranged in tiles. The chunks 101, 102, 103 and 104 and the chunk selector circuits 131, 132, 133 and 134 are in a first tile 160 labeled Tile 0. The chunks 106, 107, 108 and 109 and the chunk selector circuits 136, 137, 138 and 139 are in a second tile 162 labeled Tile 1. The chunks 111, 112, 113 and 114 and the chunk selector circuits 141, 142, 143 and 144 are in a third tile 164 labeled Tile 2. The chunks 116, 117, 118 and 119 and the chunk selector circuits 146, 147, 148 and 149 are in a fourth tile 166 labeled Tile 3. Each tile is comprised of four of the chunks 101-119. The chunks in each tile share data lines. Each chunk 101-119 therefore belongs to one block and one tile in the array 100, and each chunk 101-119 can be enabled or disabled during a programming operation by control signals generated for the block 150-156 and the tile 160-166 that include the respective chunk 101-119.

Each tile 160-166 includes a page buffer coupled to the data lines in the tile. The first tile 160 includes a page buffer 170. The second tile 162 includes a page buffer 172. The third tile 164 includes a page buffer 174. The fourth tile 166 includes a page buffer 176. The page buffers 170-176 occupy a page buffer area 178 in the array 100 next to the blocks 150-156. Data in the page buffers 170-176 can be transferred to or from one or more global data lines through transistors (not shown) at locations in the page buffers 170-176 that represent different column addresses in the array 100. For example, a first column address 184 is located in the page buffer 172, and a second column address 186 is located in the page buffer 174. The page buffers 170-176 will be further described hereinbelow.

Global access lines 192 pass through the chunk selector circuits 131-149 to provide global access signals as will be further described hereinbelow. The array 100 may be a portion of a not AND (NAND) memory device according to various embodiments of the invention. All of the cells in a block can be erased at the same operation in a NAND memory device. The array 100 may be a portion of a cross point cell array in a memory device according to various embodiments of the invention.

Figure 2:
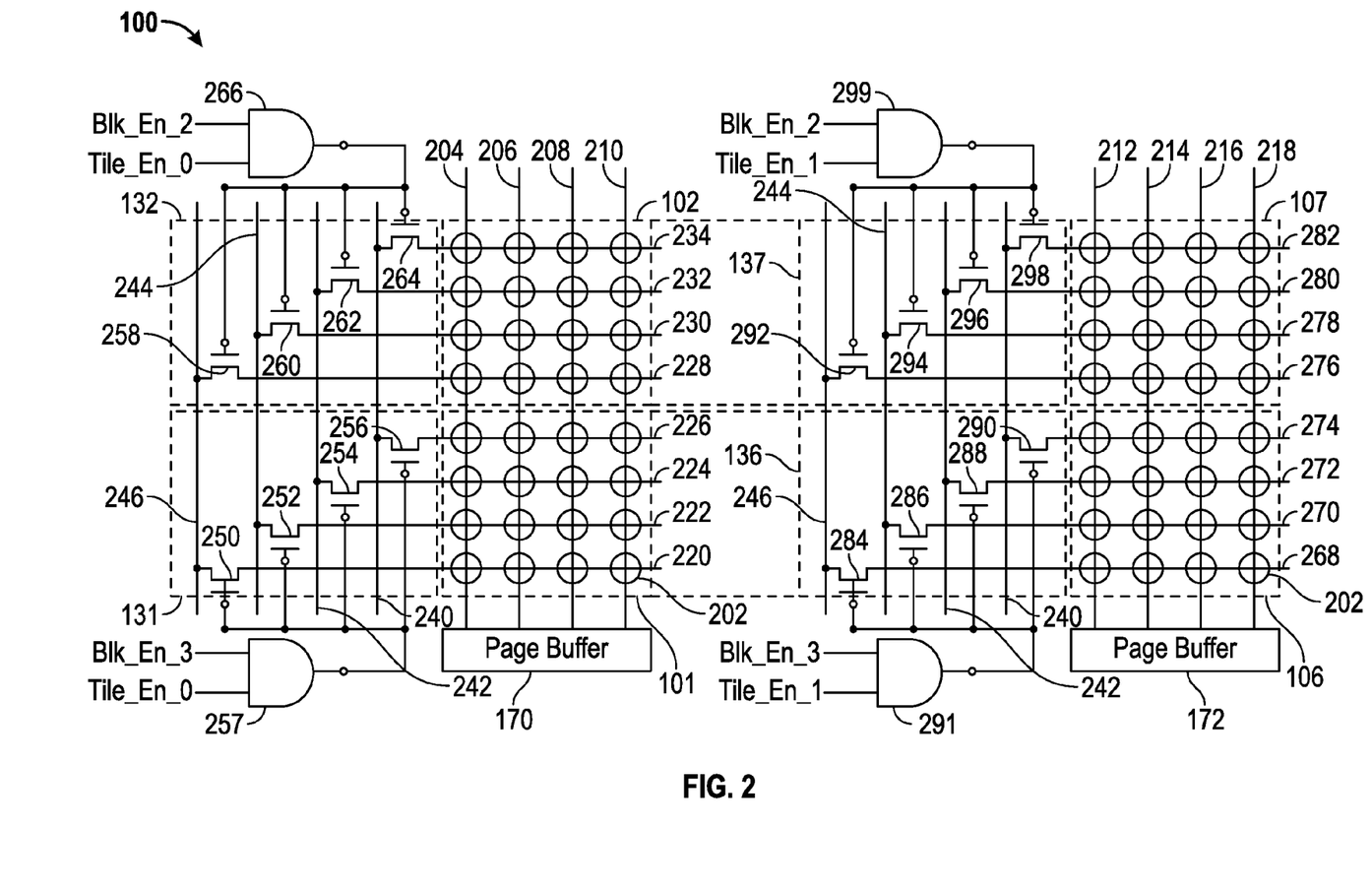
FIG. 2 is an electrical schematic diagram of a portion of the array shown in FIG. 1 according to various embodiments of the invention.

FIG. 2 is an electrical schematic diagram of a portion of the array 100 shown in FIG. 1 according to various embodiments of the invention. More specifically, FIG. 2 is an electrical schematic diagram of the chunks 101, 102, 106 and 107 and the chunk selector circuits 131, 132, 136 and 137. The chunks 102 and 107 belong to the third block 154 and the chunks 101 and 106 belong to the fourth block 156 shown in FIG. 1. The chunks 101 and 102 belong to the first tile 160 and the chunks 106 and 107 belong to the second tile 162 shown in FIG. 1.

Each of the chunks 101, 102, 106 and 107 includes 16 cells 202, although the chunks 101, 102, 106 and 107 may include more or fewer cells 202. The cells 202 in the first tile 160 are coupled to four data lines 204, 206, 208 and 210 to sense data in the cells 202. Each of the data lines 204, 206, 208 and 210 is coupled to four of the cells 202 in the chunk 101, four of the cells 202 in the chunk 102 and the page buffer 170. The cells 202 in the second tile 162 are coupled to four data lines 212, 214, 216 and 218 to sense data in the cells 202. Each of the data lines 212, 214, 216 and 218 is coupled to four of the cells 202 in the chunk 106, four of the cells 202 in the chunk 107 and the page buffer 172.

The cells 202 are also coupled to local access lines to select the cells 202 in the array 100. In the first tile 160, local access lines 220, 222, 224 and 226 are each coupled to four of the cells 202 in the chunk 101. Local access lines 228, 230, 232 and 234 are each coupled to four of the cells 202 in the chunk 102. The local access lines 220-234 receive global access signals from one of four global access lines 240, 242, 244 and 246 that pass through the chunk selector circuits 131 and 132.

Each of the local access lines 220-226 in the chunk 101 is coupled to a first terminal of one of four n-channel transistors 250, 252, 254 and 256 in the chunk selector circuit 131. A second terminal of each of the transistors 250, 252, 254 and 256 is coupled to a respective one of the global access lines 240, 242, 244 and 246. Control terminals of the transistors 250-256 are coupled together to receive the same signal from an output of an AND gate 257. All of the transistors 250-256 can be switched on at the same time by a logic high chunk enable signal from the AND gate 257 to couple the local access lines 220-226 to the global access lines 240-246, respectively, to enable a programming operation or a read operation on the cells 202 in the chunk 101. All of the transistors 250-256 can be switched off at the same time by a logic low chunk enable signal from the AND gate 257 to substantially isolate the local access lines 220-226 from the global access lines 240-246, respectively, to disable a programming operation or a read operation on the cells 202 in the chunk 101.

Each of the local access lines 228-234 in the chunk 102 is coupled to a first terminal of one of four n-channel transistors 258, 260, 262 and 264 in the chunk selector circuit 132. A second terminal of each of the transistors 258, 260, 262 and 264 is coupled to a respective one of the global access lines 240, 242, 244 and 246. Control terminals of the transistors 258-264 are coupled together to receive the same signal from an output of an AND gate 266. All of the transistors 258-264 can be switched on at the same time by a logic high chunk enable signal from the AND gate 266 to couple the local access lines 228-234 to the global access lines 240-246, respectively, to enable a programming operation or a read operation on the cells 202 in the chunk 102. All of the transistors 258-264 can be switched off at the same time by a logic low chunk enable signal from the AND gate 266 to substantially isolate the local access lines 228-234 from the global access lines 240-246, respectively, to disable a programming operation or a read operation on the cells 202 in the chunk 102.

In the second tile 162, local access lines 268, 270, 272 and 274 are each coupled to four of the cells 202 in the chunk 106. Local access lines 276, 278, 280 and 282 are each coupled to four of the cells 202 in the chunk 107. The local access lines 268-282 receive global access signals from one of the global access lines 240-246 that pass through the chunk selector circuits 136 and 137. The global access lines 240-246 are the same for both tiles 160 and 162, although there may be different global access lines coupled to the chunks 106 and 107 in the second tile 162.

Each of the local access lines 268-274 in the chunk 106 is coupled to a first terminal of one of four n-channel transistors 284, 286, 288 and 290 in the chunk selector circuit 136. A second terminal of each of the transistors 284, 286, 288 and 290 is coupled to a respective one of the global access lines 240, 242, 244 and 246. Control terminals of the transistors 284-290 are coupled together to receive the same signal from an output of an AND gate 291. All of the transistors 284-290 can be switched on at the same time by a logic high chunk enable signal from the AND gate 291 to couple the local access lines 268-274 to the global access lines 240-246, respectively, to enable a programming operation or a read operation on the cells 202 in the chunk 106. All of the transistors 284-290 can be switched off at the same time by a logic low chunk enable signal from the AND gate 291 to substantially isolate the local access lines 268-274 from the global access lines 240-246, respectively, to disable a programming operation or a read operation on the cells 202 in the chunk 106.

Each of the local access lines 276-282 in the chunk 107 is coupled to a first terminal of one of four n-channel transistors 292, 294, 296 and 298 in the chunk selector circuit 137. A second terminal of each of the transistors 292, 294, 296 and 298 is coupled to a respective one of the global access lines 240, 242, 244 and 246. Control terminals of the transistors 292-298 are coupled together to receive the same signal from an output of an AND gate 299. All of the transistors 292-298 can be switched on at the same time by a logic high chunk enable signal from the AND gate 299 to couple the local access lines 276-282 to the global access lines 240-246, respectively, to enable a programming operation or a read operation on the cells 202 in the chunk 107. All of the transistors 292-298 can be switched off at the same time by a logic low chunk enable signal from the AND gate 299 to substantially isolate the local access lines 276-282 from the global access lines 240-246, respectively, to disable a programming operation or a read operation on the cells 202 in the chunk 107.

The chunks 101, 102, 106 and 107 are enabled or disabled by block enable signals BLK_EN and tile enable signals TILE_EN that can be generated by a block and tile selector circuit that will be described hereinbelow. Each block enable signal BLK_EN can enable or disable all of the chunks in a block. Each tile enable signal TILE_EN can enable or disable all of the chunks in a tile. With reference to FIG. 2, the AND gate 257 is coupled to receive a block enable signal BLK_EN_3 to enable or disable all of the chunks in the fourth block 156 and a tile enable signal TILE_EN_0 to enable or disable all of the chunks in the first tile 160. When both of these signals are logic high, the AND gate 257 produces a logic high signal to switch on the transistors 250-256 to couple the local access lines 220-226 to the global access lines 240-246 to enable the chunk 101. When either of these signals is logic low, the AND gate 257 produces a logic low signal to switch off the transistors 250-256.

A block enable signal BLK_EN_2 can enable or disable all of the chunks in the third block 154. A logic high block enable signal BLK_EN_2 and a logic high tile enable signal TILE_EN_0 coupled to inputs of the AND gate 266 enable the chunk 102. When either of these signals is logic low, the AND gate 266 produces a logic low signal to disable the chunk 102.

A tile enable signal TILE_EN_1 can enable or disable all of the chunks in the second tile 162. A logic high block enable signal BLK_EN_3 and a logic high tile enable signal TILE_EN_1 coupled to inputs of the AND gate 291 enable the chunk 106. When either of these signals is logic low, the AND gate 291 produces a logic low signal to disable the chunk 106. A logic high block enable signal BLK_EN_2 and a logic high tile enable signal TILE_EN_1 coupled to inputs of the AND gate 299 enable the chunk 107. When either of these signals is logic low, the AND gate 299 produces a logic low signal to disable the chunk 107. When a chunk 101-119 is enabled, the cells 202 in the chunk may be programmed, read or erased.

Figure 3:
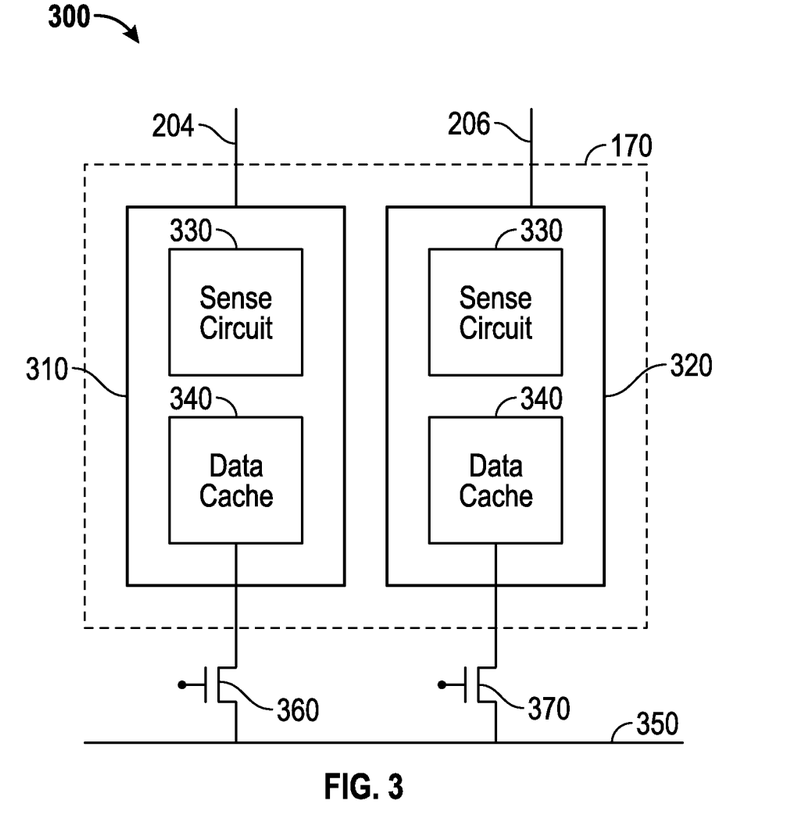
FIG. 3 is a block diagram of a portion of the page buffer shown in FIG. 1 and FIG. 2 according to various embodiments of the invention.

FIG. 3 is a block diagram of a portion 300 of the page buffer 170 shown in FIG. 1 and FIG. 2 according to various embodiments of the invention. The portion 300 of the page buffer 170 is coupled to two of the data lines 204 and 206 passing through the first tile 160. The data line 204 is coupled to a first sense and latch circuit 310 and the data line 206 is coupled to a second sense and latch circuit 320. Each of the sense and latch circuits 310 and 320 comprises a sense circuit 330 and a data cache 340. The data cache 340 can be DRAM or static random access memory (SRAM) devices.

The page buffer 170 temporarily stores read data during a read operation or program data during a programming operation. During a read operation, data in the cells 202 are sensed and latched by the page buffer 170. The latched data in the sense and latch circuit 310 can be transferred to a global data line 350 through an n-channel transistor 360. The latched data in the sense and latch circuit 320 can be transferred to the global data line 350 through an n-channel transistor 370. The transistors 360 and 370 can be switched on by signals representing different column addresses in the array 100. The data on the global data line 350 are transferred to input/output (I/O) buffers and then to an external I/O bus (not shown). During a programming operation, program data is transferred from the (I/O) buffers and the global data line 350 to the page buffer 170 by asserting its column addresses. The page buffer 170 biases data lines 204 and 206 with the latched program data. Thus, the data can go in both directions through the page buffer 170.

One or more of the chunks 101-119 can be disabled during a read operation to save power according to various embodiments of the invention. A memory request may be received by a memory device including the array 100 for data in the fourth block 156 between the first column address 184 and the second column address 186 shown in FIG. 1. The chunks 101 and 116 may be disabled by the chunk selector circuits 131 and 146, respectively, to save power while data is read from cells in the chunks 106 and 111. Data lines such as the data lines 204-218 shown in FIG. 2 can be deselected when the chunks to which they are coupled have been disabled. Data lines 204-218 associated with the disabled chunks 101 and 116 can be deselected such that they are not pre-charged to save power.

Cells in individual chunks can be selected to be programmed while other chunks in a block are disabled. For example, referring to FIG. 1, the chunk 104 in the first block 150 can be selected by an initial column address and the cells in the chunk 104 can be programmed with data. The chunk 114 in the first block 150 can be selected by an initial column address and the cells in the chunk 114 can be programmed with data at the same time that the cells in the chunk 104 are being programmed. The chunks 109 and 119 in the first block 150 can be disabled by the chunk selector circuits 139 and 149, respectively, while cells in the chunks 104 and 114 are being programmed. Data lines associated with the disabled chunks 109 and 119 can be deselected such that they are not pre-charged to save power while cells in the chunks 104 and 114 are being programmed.

Figure 4:
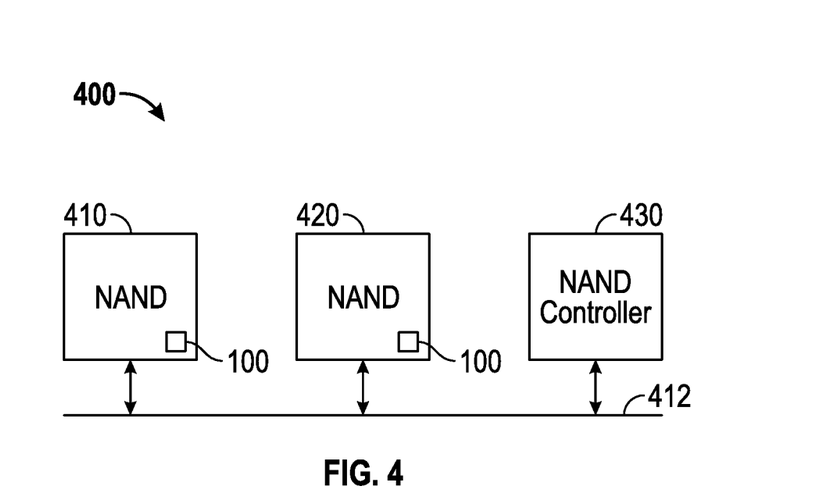
FIG. 4 is a block diagram of an apparatus in the form of a system according to various embodiments of the invention.

FIG. 4 is a block diagram of an apparatus in the form of a system 400 according to various embodiments of the invention. The system 400 includes a first NAND memory device 410 coupled to a bus 412 and a second NAND memory device 420 coupled to the bus 412. A NAND controller 430 is also coupled to the bus 412 to communicate with and control operations in the first and second NAND memory devices 410 and 420. The NAND controller 430 can comprise control circuitry, firmware, software or combinations of any or all of the foregoing. Each of the first and second NAND memory devices 410 and 420 includes an array of cells such as the array 100 including the portions of the array 100 shown in FIG. 1 and/or FIG. 2. Each of the first and second NAND memory devices 410 and 420 may send data to the NAND controller 430 to indicate the number of chunks that are enabled to be accessed by being programmed or read. The NAND controller 430 can monitor the number of chunks in the system 400 that are enabled to be programmed or read and send control signals to the first and second NAND memory devices 410 and 420 over the bus 412 to limit the number of chunks enabled to be programmed or read. The number of chunks enabled to be programmed or read in the system 400 may be limited to manage power dissipation or current flow in the system 400. The first and second NAND memory devices 410 and 420 may also provide data to the NAND controller 430 indicating the amount of power or current being dissipated.

Figure 5:
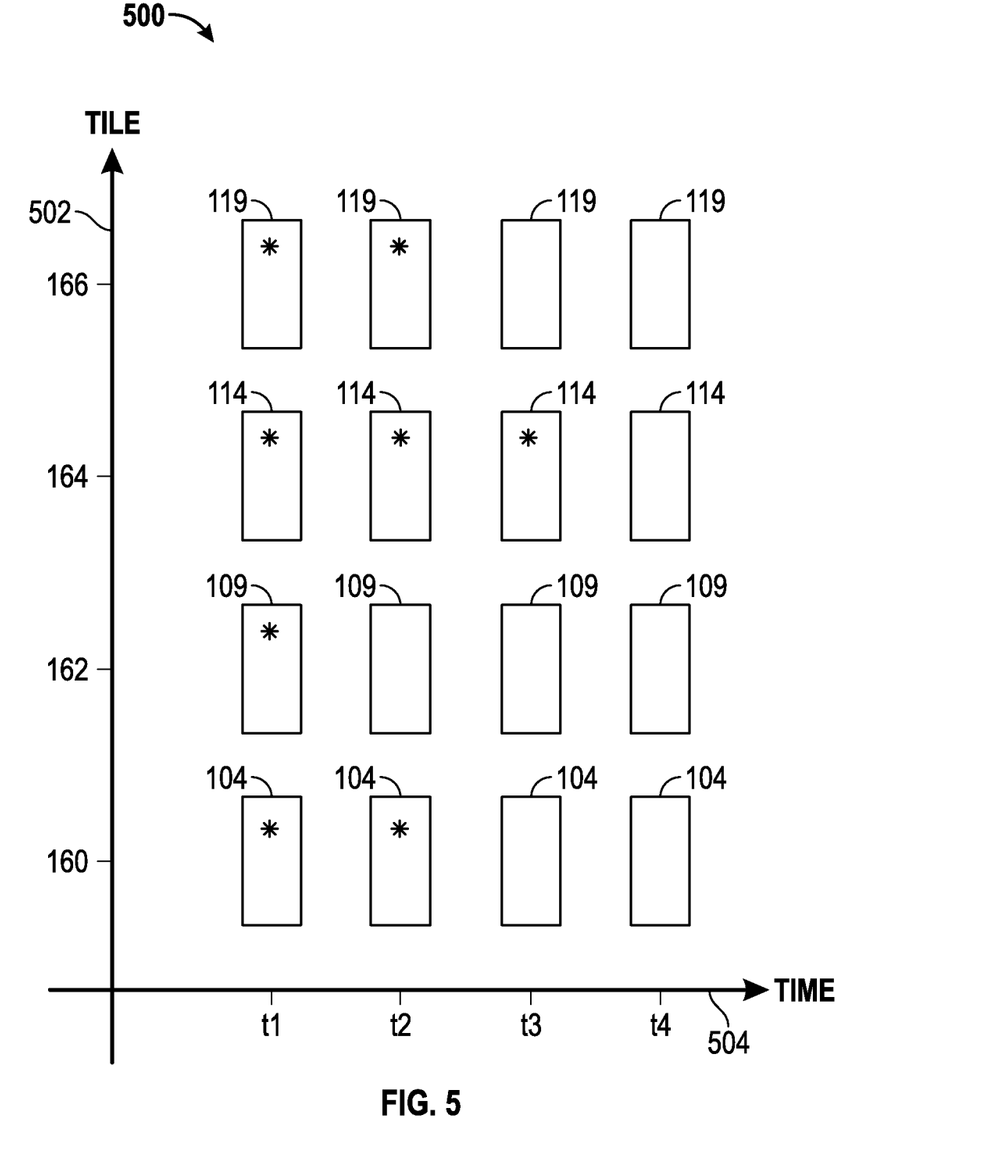
FIG. 5 is a timing diagram for the array of FIG. 1 and FIG. 2 illustrating a programming operation according to various embodiments of the invention.

FIG. 5 is a timing diagram 500 for the array 100 of FIG. 1 and FIG. 2 illustrating a programming operation according to various embodiments of the invention. The timing diagram 500 illustrates the chunks 104, 109, 114 and 119 of the first block 150 in FIG. 1 during the programming operation. The chunks 104, 109, 114 and 119 including the symbol "*" are enabled to be programmed by the respective chunk selector circuit. The chunks 104, 109, 114 and 119 that do not include the symbol "*" have been disabled by the respective chunk selector circuit 134, 139, 144 and 149. A chunk is enabled when its local access lines are coupled to the global access lines 240-246 shown in FIG. 2 by the chunk selector circuit and cells 202 in the chunk can be programmed by a programming pulse on the global access lines 240-246. The tiles 160, 162, 164 and 166 are represented on a vertical axis 502, and time is represented on a horizontal axis 504.

A first programming pulse is applied at a time t1 when all of the chunks 104, 109, 114 and 119 are enabled such that cells 202 in all of the chunks 104, 109, 114 and 119 receive a programming pulse. A first program verify pulse is applied to cells 202 in all of the chunks 104, 109, 114 and 119 to produce data to indicate if these cells 202 are programmed. Data indicating that cells 202 in the chunk 109 were fully programmed results in a TILE_EN_1 signal going logic low to disable the chunk 109 before a time t2. A second programming pulse is applied to cells 202 in the chunks 104, 114 and 119 at the time t2 to program cells 202 in the chunks 104, 114 and 119 that remain enabled.

The programming pulses and the program verify pulses can be shortened each time one of the chunks 104, 109, 114 and 119 is disabled to save power due to a smaller load capacitance associated with fewer enabled chunks. Pulse width can be modulated for the programming pulses and the program verify pulses based on the number of chunks enabled in the array 100 to reduce the time needed for a programming operation. The second programming pulse is therefore shorter than the first programming pulse. A second program verify pulse is applied to cells 202 in the chunks 104, 114 and 119 to produce data to indicate if these cells 202 are programmed. The second program verify pulse is shorter than the first program verify pulse. A program verify pulse is not applied to the cells 202 in the disabled chunk 109 to save power.

Data indicating that selected cells 202 in the chunks 104 and 119 were fully programmed results in the TILE_EN_0 signal and a TILE_EN_3 signal going logic low to disable the chunks 104 and 119 before a time t3. A third programming pulse is applied to cells 202 in the chunk 114 at the time t3 to program cells 202 in the chunk 114 that remains enabled. The third programming pulse is shorter than the second programming pulse. A third program verify pulse is applied to cells 202 in the chunk 114 to produce data to indicate if these cells 202 are programmed. The third program verify pulse is shorter than the second program verify pulse. A program verify pulse is not applied to the cells 202 in the disabled chunks 104, 109 and 119 to save power. Data indicating that cells 202 in the chunk 114 were fully programmed result in a TILE_EN_2 signal going logic low to disable the chunk 114 before a time t4. The programming operation ends at the time t4 when none of the chunks 104, 109, 114 and 119 are enabled.

Data lines such as the data lines 204-218 shown in FIG. 2 can be deselected when the chunks to which they are coupled have been disabled. The deselected data lines are not pre-charged to save power. The embodiments of the invention described herein shorten the biasing time for local access lines and data lines which results in reduced stress or disturbance for neighboring lines.

When the programming operation or a read operation is finished, the data indicating that selected cells 202 in the chunks 104, 109, 114 and 119 were programmed or deselected for the read operation are reset before a new programming or read operation.

With respect to FIG. 1 and FIG. 5, the fourth block 156 may be a redundancy block with the chunks 101, 106, 111 and 116 in the fourth block 156 being available to replace other chunks in the respective tiles 160, 162, 164 and 166. For example, the chunk 101 may replace the chunk 103 and the chunk 106 may replace the chunk 109. For the programming operation shown in FIG. 5, the chunk 109 may be replaced by the chunk 106 while the cells 202 in the chunks 104, 114 and 119 receive the programming pulses.

Figure 6:
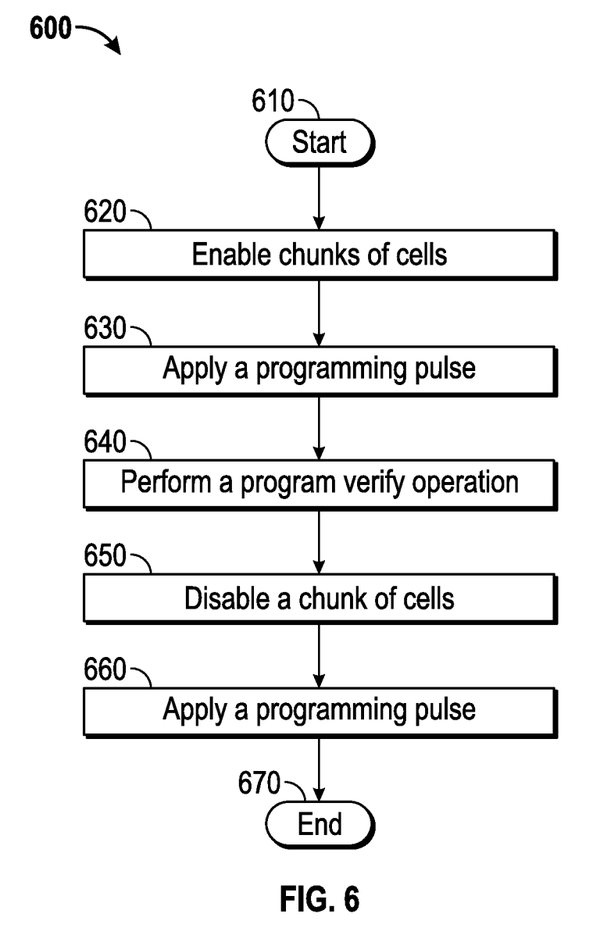
FIG. 6 is a flow diagram of one method according to various embodiments of the invention.

FIG. 6 is a flow diagram of one method 600 according to various embodiments of the invention. In block 610, the method 600 starts. In block 620, a number of chunks of cells 202 are enabled to be programmed. In block 630, a programming pulse is applied to all of the cells 202 in the enabled chunks. In block 640, a program verify operation is performed on the cells 202 in the enabled chunks to produce data to indicate the cells 202 that were programmed by the programming pulse. The program verify operation includes applying a program verify pulse to the cells 202 in the enabled chunks. In block 650, one of the chunks is disabled when all of its cells 202 have been programmed. In block 660, a programming pulse is applied to the enabled chunks. In block 670, the method 600 ends. Various embodiments may have more or fewer activities than those shown in FIG. 6. In some embodiments, the activities in FIG. 6 may be repeated, substituted for one another, and/or performed in serial or parallel fashion.

Figure 7:
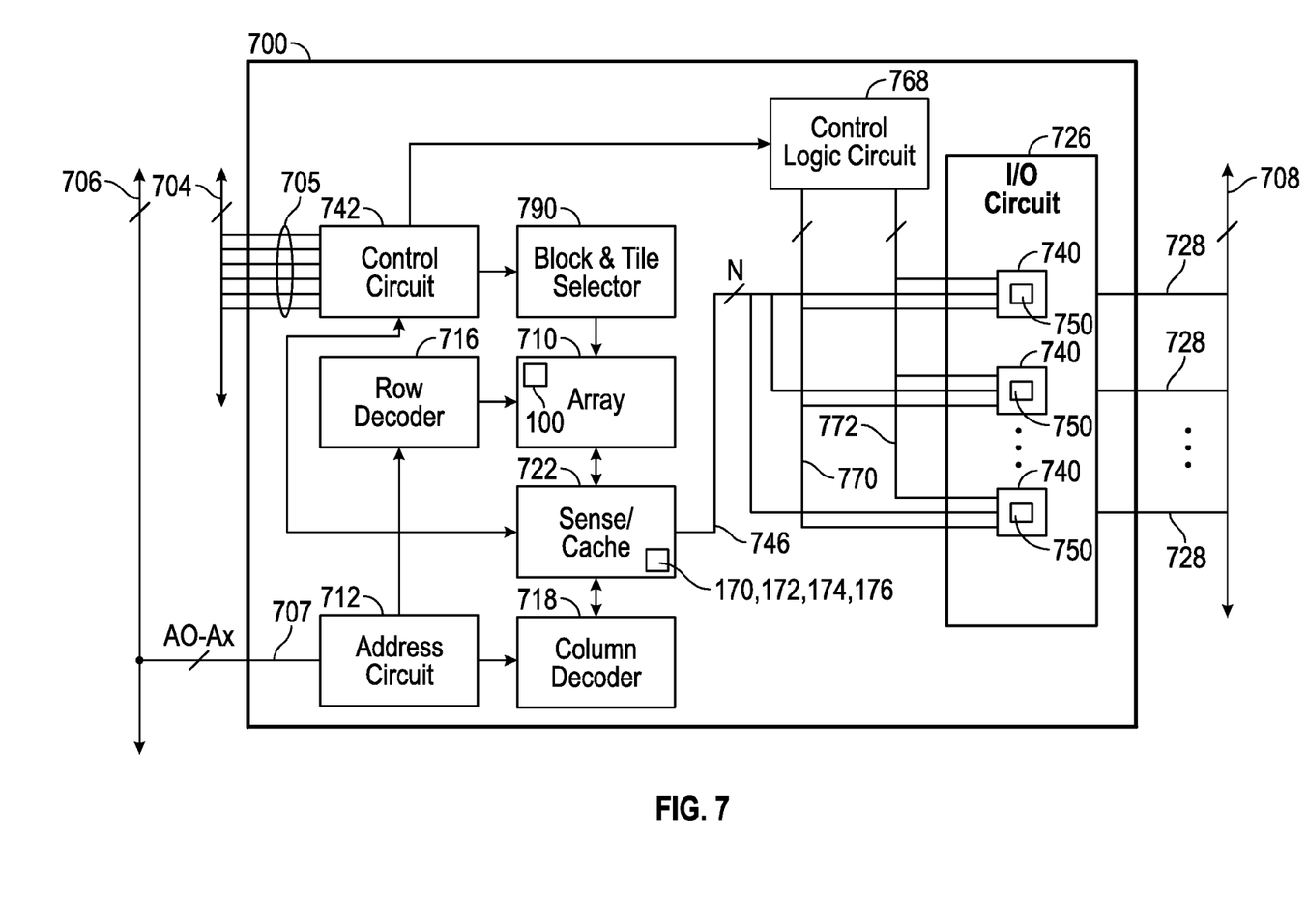
FIG. 7 is a block diagram of an apparatus in the form of a memory device according to various embodiments of the invention.

FIG. 7 is a block diagram of an apparatus in the form of a memory device 700 according to various embodiments of the invention. The memory device 700 is coupled to a control bus 704 to receive multiple control signals over control signal lines 705. The memory device 700 is also coupled to an address bus 706 to receive address signals A0-Ax on address signal lines 707 and to a data bus 708 to transmit and receive data signals. Although depicted as being received on separate physical busses, the data signals could also be multiplexed and received on the same physical bus.

The memory device 700 includes one or more arrays 710 of cells 202 that can be arranged in rows and in columns. The cells 202 of the array 710 can comprise DRAM cells or phase change cells or charge storage cells (e.g., Flash memory cells with floating gate transistors or charge trap transistors) according to various embodiments of the invention. The memory device 700 can comprise a NAND memory device. The array 710 can include multiple banks and blocks of cells 202 residing on a single die or on multiple dice as part of the memory device 700. The cells 202 in the array 710 can be single level cell (SLC) or multilevel cell (MLC) cells, or combinations thereof. The array 710 can be a cross point cell array. The array 710 can include the array 100 of cells 202, a portion of which is shown in FIG. 1 and FIG. 2 according to various embodiments of the invention.

An address circuit 712 can latch the address signals A0-Ax received on the address signal lines 707. The address signals A0-Ax can be decoded by a row decoder 716 and a column decoder 718 to access data stored in the array 710. The memory device 700 can read data in the array 710 by sensing voltage or current changes in cells 202 in the array 710 using sense devices in a sense/cache circuit 722. The sense/cache circuit 722 includes the page buffers 170, 172, 174 and 176 shown in FIG. 1 and FIG. 2 according to various embodiments of the invention.

A data input and output (I/O) circuit 726 implements bi-directional data communication over external (e.g., data I/O) nodes 728 coupled to the data bus 708. The I/O circuit 726 includes N driver and receiver circuits 740 according to various embodiments of the invention. The memory device 700 includes a controller that is configured to support operations of the memory device 700, such as reading data, writing data to and/or erasing data from the array 710. The controller can comprise, for example, control circuitry 742 (e.g., configured to implement a state machine) on a same or different die than that which includes the array 710 and/or any or all of the other components of the memory device 700. The controller can comprise the control circuitry 742, firmware, software or combinations of any or all of the foregoing. Data can be transferred between the sense/cache circuit 722 and the I/O circuit 726 over N signal lines 746. A memory request can be received in the control signals and the address signals A0-Ax and can be executed by the controller.

Each driver and receiver circuit 740 can include a driver circuit 750. Control signals can be provided to the driver circuits 750 (e.g., through control logic circuit 768 that is coupled to the control circuitry 742). The control logic circuit 768 can provide the control signals over lines 770 and 772 to the driver circuits 750.

The controller has bi-directional data communication with the sense/cache circuit 722 such that data latched in the sense/cache circuit 722 is received by the controller such that the controller is aware of the cells 202 in the array 100 that have been successfully programmed and the cells 202 in the array 100 that need further programming pulses to be programmed. The controller is coupled to send this information to a block and tile selector circuit 790 that can generate the block enable signals BLK_EN and tile enable signals TILE_EN that are coupled to the array 710 to enable or disable chunks in the array 710 according to various embodiments of the invention. The block and tile selector circuit 790 can be part of the controller according to various embodiments of the invention.

Apparatuses and methods described herein disable one or more chunks of cells when they are not being read or programmed. The total power expended for read and program operations is reduced when chunks can be disabled. This can lead to a significant performance improvement.

Example structures and methods have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising:
   a chunk of memory cells in an array of memory cells, wherein the chunk of memory cells is one of a plurality of chunks of memory cells in a block of memory cells; and
   a chunk selector circuit coupled to the memory cells in the chunk of memory cells and configured to enable or disable the memory cells,
   wherein each chunk of memory cells in the block of memory cells is coupled to a different respective one of a plurality of chunk selector circuits,
   each chunk selector circuit comprising,
   a plurality of transistors, each transistor coupled between a respective global access line of a plurality of global access lines and a respective local access line of a plurality of local access lines of each respective chunk of memory cells,
   wherein all of the plurality of transistors are switched on or switched off simultaneously to respectively enable or disable the chunk of memory cells coupled to that respective chunk selector circuit.

2. The apparatus of claim 1, further comprising a tile of memory cells comprising one chunk of memory cells, and the respective chunk selector for the one chunk of memory cells, from each of a plurality of blocks of memory cells.

3. The apparatus of claim 2, wherein the chunk selector is configured to disable memory cells in the respective chunk from being accessed while other chunks of memory cells in the tile are accessed.

4. The apparatus of claim 2, wherein each chunk selector in the tile of memory cells is configured to disable its respective chunk of memory cells from being programmed, wherein the chunks of memory cells are disabled individually or in groups of chunks.

5. The apparatus of claim 2, wherein the chunks of memory cells in the tile are coupled to a data line.

6. The apparatus of claim 5, further comprising a page buffer in the tile coupled to the data line.

7. The apparatus of claim 1, wherein the chunk selector is configured to disable memory cells in the respective chunk from being accessed while other chunks of memory cells in the block of memory cells are being accessed.

8. The apparatus of claim 7, wherein each chunk selector in the block of memory cells is configured to disable its respective chunk of memory cells from being programmed, wherein the chunks of memory cells are disabled individually or in groups of chunks.

9. An apparatus comprising:
   a plurality of tiles of memory cells, each tile comprising a plurality of individually selectable chunks of memory cells; and
   a plurality of chunk selector circuits, each chunk selector circuit coupled to a respective chunk of the plurality of chunks to enable or disable the memory cells in its respective chunk of memory cells,
   each chunk selector circuit configured to disable its respective chunk of memory cells from being programmed when the memory cells in the respective chunk are programmed and while a programming pulse is being applied to other memory cells in the tile of memory cells,
   each chunk selector circuit comprising,
   a plurality of transistors, each transistor coupled between a respective global access line of a plurality of global access lines and a respective local access line of a plurality of local access lines of each respective chunk of memory cells,
wherein all of the plurality of transistors are switched on or switched off simultaneously to respectively enable or disable the chunk of memory cells coupled to that respective chunk selector circuit.

10. The apparatus of claim 9, further comprising a global access line coupled to each of the plurality of chunk selector circuits.

11. The apparatus of claim 10, wherein each of the plurality of chunk selector circuits is configured to couple the global access line to local access lines of its respective chunk to enable the memory cells in the respective chunk.

12. The apparatus of claim 10, wherein each of the plurality of chunk selector circuits is configured to isolate local access lines of its respective chunk from the global access line to disable the memory cells in the respective chunk.

13. The apparatus of claim 9, wherein each of the plurality of chunks of memory cells is part of a different block of memory cells of a plurality of blocks of memory cells.

14. The apparatus of claim 9, wherein the plurality of chunks of memory cells comprise DRAM cells, phase change cells, or non-volatile cells.

15. The apparatus of claim 9, further comprising a plurality of page buffers wherein each tile comprises a different page buffer coupled to the respective chunk of memory cells.

16. The apparatus of claim 9, wherein each chunk selector circuit comprises a plurality of transistors, each transistor coupled to a different local access line of the respective chunk of memory cells.

17. A method comprising:
enabling a plurality of chunks of memory cells in a tile of memory cells to be accessed, wherein the tile of memory cells includes a different chunk from each of a plurality of blocks of memory cells;
accessing the memory cells in the plurality of chunks of memory cells;
disabling one or more chunks of the plurality of chunks from further access; and
continuing to access the memory cells in the chunks of the plurality of chunks that remain enabled;
wherein enabling and disabling is performed through a chunk selector circuit, each chunk selector circuit comprising a plurality of transistors, each transistor coupled between a respective global access line of a plurality of global access lines and a respective local access line of a plurality of local access lines of each respective chunk of memory cells, and
the method further comprising simultaneously switching on the plurality of transistors to enable or simultaneously switching off the plurality of transistors to disable each respective chunk of memory cells.

18. The method of claim 17, wherein enabling the plurality of chunks further comprises coupling a respective global access line for the tile to respective local access lines in each of the plurality of chunks of the tile.

19. The method of claim 17, wherein disabling one or more chunks of the plurality of chunks comprises isolating the respective global access line from the respective local access lines.

20. The method of claim 17, wherein accessing the memory cells comprises performing a programming operation or a read operation.

* * * * *